United States Patent
Shtrom et al.

(10) Patent No.: US 7,525,486 B2
(45) Date of Patent: *Apr. 28, 2009

(54) INCREASED WIRELESS COVERAGE PATTERNS

(75) Inventors: Victor Shtrom, Sunnyvale, CA (US);
Darin T. Milton, Campbell, CA (US);
William S. Kish, Saratoga, CA (US)

(73) Assignee: Ruckus Wireless, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/714,707

(22) Filed: Mar. 5, 2007

(65) Prior Publication Data

US 2007/0218953 A1    Sep. 20, 2007

Related U.S. Application Data

(63) Continuation of application No. 11/022,080, filed on Dec. 23, 2004, now Pat. No. 7,193,562.

(60) Provisional application No. 60/630,499, filed on Nov. 22, 2004.

(51) Int. Cl.
*H01Q 1/38*    (2006.01)
*H01Q 9/28*    (2006.01)
*H01Q 3/24*    (2006.01)

(52) U.S. Cl. ............... 343/700 MS; 343/795; 343/876

(58) Field of Classification Search .......... 343/700 MS, 343/793, 795, 846, 876; 455/168.1
See application file for complete search history.

(56) References Cited

U.S. PATENT DOCUMENTS 723,188 A    3/1903    Tesla 725,605 A    4/1903    Tesla (Continued)

FOREIGN PATENT DOCUMENTS

EP    0 534 612    3/1993

(Continued)

OTHER PUBLICATIONS

"Authorization of Spread Spectrum Systems Under Parts 15 and 90 of the FCC Rules and Regulations," Rules and Regulations Federal Communications Commission, 47 CFR Part 2, 15, and 90, Jun. 18, 1985.

(Continued)

*Primary Examiner*—Shih-Chao Chen
(74) *Attorney, Agent, or Firm*—Carr & Ferrell LLP

(57) ABSTRACT

A circuit board for wireless communications includes communication circuitry for modulating and/or demodulating a radio frequency (RF) signal and an antenna apparatus for transmitting and receiving the RF signal, the antenna apparatus having selectable antenna elements located near one or more peripheries of the circuit board. A first antenna element produces a first directional radiation pattern; a second antenna element produces a second directional radiation pattern offset from the first radiation pattern. The antenna elements may include one or more reflectors configured to provide gain and broaden the frequency response of the antenna element. A switching network couples one or more of the selectable elements to the communication circuitry and provides impedance matching regardless of which or how many of the antenna elements are selected. Selecting different combinations of antenna elements results in a configurable radiation pattern; alternatively, selecting several elements may result in an omnidirectional radiation pattern.

31 Claims, 5 Drawing Sheets

U.S. PATENT DOCUMENTS

| | | |
|---|---|---|
| 1,869,659 A | 8/1932 | Broertjes |
| 2,292,387 A | 8/1942 | Markey et al. |
| 3,488,445 A | 1/1970 | Chang |
| 3,568,105 A | 3/1971 | Felsenheld |
| 3,967,067 A | 6/1976 | Potter |
| 3,982,214 A | 9/1976 | Burns |
| 3,991,273 A | 11/1976 | Mathes |
| 4,001,734 A | 1/1977 | Burns |
| 4,176,356 A | 11/1979 | Foster et al. |
| 4,193,077 A | 3/1980 | Greenberg et al. |
| 4,305,052 A | 12/1981 | Baril et al. |
| 4,554,554 A | 11/1985 | Olesen et al. |
| 4,733,203 A | 3/1988 | Ayasli |
| 4,814,777 A | 3/1989 | Monser |
| 5,063,574 A | 11/1991 | Moose |
| 5,173,711 A | 12/1992 | Takeuchi et al. |
| 5,208,564 A | 5/1993 | Burns et al. |
| 5,220,340 A | 6/1993 | Shafai |
| 5,282,222 A | 1/1994 | Fattouche et al. |
| 5,291,289 A | 3/1994 | Hulyalkar et al. |
| 5,311,550 A | 5/1994 | Fouche et al. |
| 5,532,708 A | 7/1996 | Krenz et al. |
| 5,559,800 A | 9/1996 | Mousseau et al. |
| 5,754,145 A | 5/1998 | Evans |
| 5,767,755 A | 6/1998 | Kim et al. |
| 5,767,809 A | 6/1998 | Chuang et al. |
| 5,786,793 A | 7/1998 | Maeda et al. |
| 5,802,312 A | 9/1998 | Lazaridis et al. |
| 5,964,830 A | 10/1999 | Durett |
| 5,990,838 A | 11/1999 | Burns et al. |
| 6,031,503 A | 2/2000 | Preiss, II et al. |
| 6,034,638 A | 3/2000 | Thiel et al. |
| 6,052,093 A | 4/2000 | Yao et al. |
| 6,091,364 A | 7/2000 | Murakami et al. |
| 6,094,177 A | 7/2000 | Yamamoto |
| 6,097,347 A | 8/2000 | Duan et al. |
| 6,104,356 A | 8/2000 | Hikuma et al. |
| 6,169,523 B1 | 1/2001 | Ploussios |
| 6,266,528 B1 | 7/2001 | Farzaneh |
| 6,292,153 B1 | 9/2001 | Aiello et al. |
| 6,307,524 B1 | 10/2001 | Britain |
| 6,317,599 B1 | 11/2001 | Rappaport et al. |
| 6,323,810 B1 | 11/2001 | Poilasne et al. |
| 6,326,922 B1 | 12/2001 | Hegendoerfer |
| 6,337,628 B2 | 1/2002 | Campana, Jr. |
| 6,337,668 B1 | 1/2002 | Ito et al. |
| 6,339,404 B1 | 1/2002 | Johnson et al. |
| 6,345,043 B1 | 2/2002 | Hsu |
| 6,356,242 B1 | 3/2002 | Ploussios |
| 6,356,243 B1 | 3/2002 | Schneider et al. |
| 6,356,905 B1 | 3/2002 | Gershman et al. |
| 6,377,227 B1 | 4/2002 | Zhu et al. |
| 6,392,610 B1 | 5/2002 | Braun et al. |
| 6,404,386 B1 | 6/2002 | Proctor, Jr. et al. |
| 6,407,719 B1 | 6/2002 | Ohira et al. |
| RE37,802 E | 7/2002 | Fattouche et al. |
| 6,424,311 B1 | 7/2002 | Tsai et al. |
| 6,442,507 B1 | 8/2002 | Skidmore et al. |
| 6,445,688 B1 | 9/2002 | Garces et al. |
| 6,456,242 B1 | 9/2002 | Crawford |
| 6,493,679 B1 | 12/2002 | Rappaport et al. |
| 6,496,083 B1 | 12/2002 | Kushitani et al. |
| 6,498,589 B1 | 12/2002 | Horii |
| 6,499,006 B1 | 12/2002 | Rappaport et al. |
| 6,507,321 B2 | 1/2003 | Oberschmidt et al. |
| 6,531,985 B1 | 3/2003 | Jones et al. |
| 6,583,765 B1 | 6/2003 | Schamberger et al. |
| 6,586,786 B2 | 7/2003 | Kitazawa et al. |
| 6,611,230 B2 | 8/2003 | Phelan |
| 6,625,454 B1 | 9/2003 | Rappaport et al. |
| 6,633,206 B1 | 10/2003 | Kato |
| 6,642,889 B1 | 11/2003 | McGrath |
| 6,674,459 B2 | 1/2004 | Ben-Shachar et al. |
| 6,701,522 B1 | 3/2004 | Rubin et al. |
| 6,725,281 B1 | 4/2004 | Zintel et al. |
| 6,753,814 B2 | 6/2004 | Killen et al. |
| 6,762,723 B2 | 7/2004 | Nallo et al. |
| 6,779,004 B1 | 8/2004 | Zintel |
| 6,819,287 B2 | 11/2004 | Sullivan et al. |
| 6,839,038 B2 | 1/2005 | Weinstein |
| 6,859,176 B2 | 2/2005 | Choi |
| 6,859,182 B2 | 2/2005 | Horii |
| 6,876,280 B2 | 4/2005 | Nakano |
| 6,876,836 B2 | 4/2005 | Lin et al. |
| 6,888,504 B2 | 5/2005 | Chiang et al. |
| 6,888,893 B2 | 5/2005 | Li et al. |
| 6,892,230 B1 | 5/2005 | Gu et al. |
| 6,903,686 B2 | 6/2005 | Vance et al. |
| 6,906,678 B2 | 6/2005 | Chen |
| 6,910,068 B2 | 6/2005 | Zintel et al. |
| 6,914,581 B1 | 7/2005 | Popek |
| 6,924,768 B2 | 8/2005 | Wu et al. |
| 6,931,429 B2 | 8/2005 | Gouge et al. |
| 6,941,143 B2 | 9/2005 | Mathur |
| 6,943,749 B2 | 9/2005 | Paun |
| 6,950,019 B2 | 9/2005 | Bellone et al. |
| 6,950,069 B2 | 9/2005 | Gaucher et al. |
| 6,961,028 B2 | 11/2005 | Joy et al. |
| 6,965,353 B2 | 11/2005 | Shirosaka et al. |
| 6,973,622 B1 | 12/2005 | Rappaport et al. |
| 6,975,834 B1 | 12/2005 | Forster |
| 6,980,782 B1 | 12/2005 | Braun et al. |
| 7,023,909 B1 | 4/2006 | Adams et al. |
| 7,034,769 B2 | 4/2006 | Surducan et al. |
| 7,034,770 B2 | 4/2006 | Yang et al. |
| 7,043,277 B1 | 5/2006 | Pfister |
| 7,050,809 B2 | 5/2006 | Lim |
| 7,053,844 B2 | 5/2006 | Gaucher et al. |
| 7,064,717 B2 | 6/2006 | Kaluzni et al. |
| 7,085,814 B1 | 8/2006 | Gandhi et al. |
| 7,088,299 B2 | 8/2006 | Siegler et al. |
| 7,089,307 B2 | 8/2006 | Zintel et al. |
| 7,120,405 B2 * | 10/2006 | Rofougaran ............. 455/168.1 |
| 7,130,895 B2 | 10/2006 | Zintel et al. |
| 7,171,475 B2 | 1/2007 | Weisman et al. |
| 7,277,063 B2 | 10/2007 | Shirosaka et al. |
| 7,312,762 B2 | 12/2007 | Puente Ballarda et al. |
| 7,319,432 B2 | 1/2008 | Andersson |
| 2001/0046848 A1 | 11/2001 | Kenkel |
| 2002/0031130 A1 | 3/2002 | Tsuchiya et al. |
| 2002/0047800 A1 | 4/2002 | Proctor, Jr. et al. |
| 2002/0080767 A1 | 6/2002 | Lee |
| 2002/0084942 A1 | 7/2002 | Tsai et al. |
| 2002/0105471 A1 | 8/2002 | Kojima et al. |
| 2002/0112058 A1 | 8/2002 | Weisman et al. |
| 2002/0158798 A1 | 10/2002 | Chiang et al. |
| 2002/0170064 A1 | 11/2002 | Monroe et al. |
| 2003/0026240 A1 | 2/2003 | Eyuboglu et al. |
| 2003/0030588 A1 | 2/2003 | Kalis et al. |
| 2003/0063591 A1 | 4/2003 | Leung et al. |
| 2003/0122714 A1 | 7/2003 | Wannagot et al. |
| 2003/0169330 A1 | 9/2003 | Ben-Shachar et al. |
| 2003/0184490 A1 | 10/2003 | Raiman et al. |
| 2003/0189514 A1 | 10/2003 | Miyano et al. |
| 2003/0189521 A1 | 10/2003 | Yamamoto et al. |
| 2003/0189523 A1 | 10/2003 | Ojantakanen et al. |
| 2003/0210207 A1 | 11/2003 | Suh et al. |
| 2003/0227414 A1 | 12/2003 | Saliga et al. |
| 2004/0014432 A1 | 1/2004 | Boyle |
| 2004/0017310 A1 | 1/2004 | Runkle et al. |
| 2004/0017860 A1 | 1/2004 | Liu |
| 2004/0027291 A1 | 2/2004 | Zhang et al. |
| 2004/0027304 A1 | 2/2004 | Chiang et al. |
| 2004/0032378 A1 | 2/2004 | Volman et al. |

| | | |
|---|---|---|
| 2004/0036651 A1 | 2/2004 | Toda |
| 2004/0036654 A1 | 2/2004 | Hsieh |
| 2004/0041732 A1 | 3/2004 | Aikawa et al. |
| 2004/0048593 A1 | 3/2004 | Sano |
| 2004/0058690 A1 | 3/2004 | Ratzel et al. |
| 2004/0061653 A1 | 4/2004 | Webb et al. |
| 2004/0070543 A1 | 4/2004 | Masaki |
| 2004/0080455 A1 | 4/2004 | Lee |
| 2004/0095278 A1 | 5/2004 | Kanemoto et al. |
| 2004/0114535 A1 | 6/2004 | Hoffmann et al. |
| 2004/0125777 A1 | 7/2004 | Doyle et al. |
| 2004/0145528 A1 | 7/2004 | Mukai et al. |
| 2004/0160376 A1 | 8/2004 | Hornsby et al. |
| 2004/0190477 A1 | 9/2004 | Olson et al. |
| 2004/0203347 A1 | 10/2004 | Nguyen |
| 2004/0260800 A1 | 12/2004 | Gu et al. |
| 2005/0022210 A1 | 1/2005 | Zintel et al. |
| 2005/0041739 A1 | 2/2005 | Li et al. |
| 2005/0042988 A1 | 2/2005 | Hoek et al. |
| 2005/0048934 A1 | 3/2005 | Rawnick et al. |
| 2005/0074018 A1 | 4/2005 | Zintel et al. |
| 2005/0097503 A1 | 5/2005 | Zintel et al. |
| 2005/0128983 A1 | 6/2005 | Kim et al. |
| 2005/0135480 A1 | 6/2005 | Li et al. |
| 2005/0138137 A1 | 6/2005 | Encarnacion et al. |
| 2005/0138193 A1 | 6/2005 | Encarnacion et al. |
| 2005/0146475 A1 | 7/2005 | Bettner et al. |
| 2005/0180381 A1 | 8/2005 | Retzer et al. |
| 2005/0188193 A1 | 8/2005 | Kuehnel et al. |
| 2005/0240665 A1 | 10/2005 | Gu et al. |
| 2005/0267935 A1 | 12/2005 | Gandhi et al. |
| 2006/0094371 A1 | 5/2006 | Nguyen |
| 2006/0098607 A1 | 5/2006 | Zeng et al. |
| 2006/0123124 A1 | 6/2006 | Weisman et al. |
| 2006/0123125 A1 | 6/2006 | Weisman et al. |
| 2006/0123455 A1 | 6/2006 | Pai et al. |
| 2006/0168159 A1 | 7/2006 | Weisman et al. |
| 2006/0184660 A1 | 8/2006 | Rao et al. |
| 2006/0184661 A1 | 8/2006 | Weisman et al. |
| 2006/0184693 A1 | 8/2006 | Rao et al. |
| 2006/0224690 A1 | 10/2006 | Falkenburg et al. |
| 2006/0225107 A1 | 10/2006 | Seetharaman et al. |
| 2006/0227761 A1 | 10/2006 | Scott, III et al. |
| 2006/0239369 A1 | 10/2006 | Lee |
| 2006/0262015 A1 | 11/2006 | Thornell-Pers et al. |
| 2006/0291434 A1 | 12/2006 | Gu et al. |
| 2007/0027622 A1 | 2/2007 | Cleron et al. |
| 2007/0115180 A1 * | 5/2007 | Kish et al. ............ 343/700 MS |
| 2007/0135167 A1 | 6/2007 | Liu |

FOREIGN PATENT DOCUMENTS

| | | |
|---|---|---|
| EP | 1 376 920 | 6/2002 |
| EP | 1 315 311 | 5/2003 |
| EP | 1 450 521 | 8/2004 |
| EP | 1 608 108 | 12/2005 |
| JP | 2008/088633 | 2/1996 |
| JP | 2001/057560 | 2/2002 |
| JP | 2005/354249 | 12/2005 |
| JP | 2006/060408 | 3/2006 |
| WO | WO 90/04893 | 5/1990 |
| WO | WO 02/25967 | 3/2002 |
| WO | WO 03/079484 | 9/2003 |

OTHER PUBLICATIONS

"Authorization of spread spectrum and other wideband emissions not presently provided for in the FCC Rules and Regulations," Before the Federal Communications Commission, FCC 81-289, 87 F.C.C.2d 876, Jun. 30, 1981.

RL Miller, "4.3 Project X—A True Secrecy System for Speech," Engineering and Science in the Bell System, A History of Engineering and Science in the Bell System National Service in War and Peace (1925-1975), pp. 296-317, 1978, Bell Telephone Laboratories, Inc.

Chang, Robert W., "Synthesis of Band-Limited Orthogonal Signals for Multichannel Data Transmission," The Bell System Technical Journal, Dec. 1966, pp. 1775-1796.

Cimini, Jr., Leonard J, "Analysis and Simulation of a Digital Mobile Channel Using Orthogonal Frequency Division Multiplexing," IEEE Transactions on Communications, vol. Com-33, No. 7, Jul. 1985, pp. 665-675.

Saltzberg, Burton R., "Performance of an Efficient Parallel Data Transmission System," IEEE Transactions on Communication Technology, vol. Com-15, No. 6, Dec. 1967, pp. 805-811.

Weinstein, S. B., et al., "Data Transmission by Frequency-Division Multiplexing Using the Discrete Fourier Transform," IEEE Transactions on Communication Technology, vol. Com-19, No. 5, Oct. 1971, pp. 628-634.

Moose, Paul H., "Differential Modulation and Demodulation of Multi-Frequency Digital Communications Signals," 1990 IEEE,CH2831-6/90/0000-0273.

Casas, Eduardo F., et al., "OFDM for Data Communication Over Mobile Radio FM Channels-Part I: Analysis and Experimental Results," IEEE Transactions on Communications, vol. 39, No. 5, May 1991, pp. 783-793.

Casas, Eduardo F., et al., "OFDM for Data Communication over Mobile Radio FM Channels; Part II: Performance Improvement," Department of Electrical Engineering, University of British Columbia.

Chang, Robert W., et al., "A Theoretical Study of Performance of an Orthogonal Multiplexing Data Transmission Scheme," IEEE Transactions on Communication Technology, vol. Com-16, No. 4, Aug. 1968, pp. 529-540.

Gledhill, J. J., et al.,"The Transmission of Digital Television in the UHF Band Using Orthogonal Frequency Division Multiplexing," Sixth International Conference on Digital Processing of Signals in Communications, Sep. 2-6, 1991, pp. 175-180.

Alard, M., et al., "Principles of Modulation and Channel Coding for Digital Broadcasting for Mobile Receivers," 8301 EBU Review Technical, Aug. 1987, No. 224, Brussels, Belgium.

Berenguer, Inaki, et al., "Adaptive MIMO Antenna Selection," Nov. 2003.

Gaur, Sudhanshu, et al., "Transmit/Receive Antenna Selection for MIMO Systems to Improve Error Performance of Linear Receivers," School of ECE, Georgia Institute of Technology, Apr. 4, 2005.

Sadek, Mirette, et al., "Active Antenna Selection in Multiuser MIMO Communications," IEEE Transactions on Signal Processing, vol. 55, No. 4, Apr. 2007, pp. 1498-1510.

Molisch, Andreas F., et al., "MIMO Systems with Antenna Selection—an Overview," Draft, Dec. 31, 2003.

Ken Tang, et al., "MAC Layer Broadcast Support in 802.11 Wireless Networks," Computer Science Department, University of California, Los Angeles, 2000 IEEE, pp. 544-548.

Ken Tang, et al., "MAC Reliable Broadcast in Ad Hoc Networks," Computer Science Department, University of California, Los Angeles, 2001 IEEE, pp. 1008-1013.

Vincent D. Park, et al., "A Performance Comparison of the Temporally-Ordered Routing Algorithm and Ideal Link-State Routing," IEEE, Jul. 1998, pp. 592-598.

Ian F. Akyildiz, et al., "A Virtual Topology Based Routing Protocol for Multihop Dynamic Wireless Networks," Broadband and Wireless Networking Lab, School of Electrical and Computer Engineering, Georgia Institute of Technology.

Dell Inc., "How Much Broadcast and Multicast Traffic Should I Allow in My Network," PowerConnect Application Note #5, Nov. 2003.

Toskala, Antti, "Enhancement of Broadcast and Introduction of Multicast Capabilities in RAN," Nokia Networks, Palm Springs, California, Mar. 13-16, 2001.

Microsoft Corporation, "IEEE 802.11 Networks and Windows XP," Windows Hardware Developer Central, Dec. 4, 2001.

Festag, Andreas, "What is MOMBASA?" Telecommunication Networks Group (TKN), Technical University of Berlin, Mar. 7, 2002.

Hewlett Packard, "HP ProCurve Networking: Enterprise Wireless LAN Networking and Mobility Solutions," 2003.

Dutta, Ashutosh et al., "MarconiNet Supporting Streaming Media Over Localized Wireless Multicast," Proc. of the 2d Int'l Workshop on Mobile Commerce, 2002.

Dunkels, Adam et al., "Making TCP/IP Viable for Wireless Sensor Networks," Proc. of the 1st Euro. Workshop on Wireless Sensor Networks, Berlin, Jan. 2004.

Dunkels, Adam et al., "Connecting Wireless Sensornets with TCP/IP Networks," Proc. of the 2d Int'l Conf. on Wired Networks, Frankfurt, Feb. 2004.

Cisco Systems, "Cisco Aironet Access Point Software Configuration Guide: Configuring Filters and Quality of Service," Aug. 2003.

Hirayama, Koji et al., "Next-Generation Mobile-Access IP Network," Hitachi Review vol. 49, No. 4, 2000.

Pat Calhoun et al., "802.11r strengthens wireless voice," Technology Update, Network World, Aug. 22, 2005, http://www.networkworld.com/news/tech/2005/082208techupdate.html.

Areg Alimian et al., "Analysis of Roaming Techniques," doc.:IEEE 802.11-04/0377r1, Submission, Mar. 2004.

Information Society Technologies Ultrawaves, "System Concept / Architecture Design and Communication Stack Requirement Document," Feb. 23, 2004.

Golmie, Nada, "Coexistence in Wireless Networks: Challenges and System-Level Solutions in the Unlicensed Bands," Cambridge University Press, 2006.

Mawa, Rakesh, "Power Control in 3G Systems," Hughes Systique Corporation, Jun. 28, 2006.

Wennstrom, Mattias et al., "Transmit Antenna Diversity in Ricean Fading MIMO Channels with Co-Channel Interference," 2001.

Steger, Christopher et al., "Performance of IEEE 802.11b Wireless LAN in an Emulated Mobile Channel," 2003.

Chang, Nicholas B. et al., "Optimal Channel Probing and Transmission Scheduling for Opportunistics Spectrum Access," Sep. 2007.

Chuang et al., A 2.4 GHz Polarization-diversity Planar Printed Dipole Antenna for WLAN and Wireless Communication Applications, Microwave Journal, vol. 45, No. 6, pp. 50-62 (Jun. 2002).

Frederick et al., Smart Antennas Based on Spatial Multiplexing of Local Elements (SMILE) for Mutual Coupling Reduction, IEEE Transactions of Antennas and Propogation, vol. 52, No. 1, pp. 106-114 (Jan. 2004).

W.E. Doherty, Jr. et al., The PIN Diode Circuit Designers's Handbook (1998).

Varnes et al., A Switched Radial Divider for an L-Band Mobile Satellite Antenna, European Microwave Conference (Oct. 1995), pp. 1037-1041.

English Translation of PCT Pub. No. WO2004/051798 (as filed US National Stage U.S. Appl. No. 10/536,547), 2004.

Behdad et al., Slot Antenna Miniaturization Using Distributed Inductive Loading Antenna and Propagation Society International Symposium, 2003 IEEE, vol. 1, pp. 308-311 (Jun. 2003).

Press Release NETGEAR RangeMax(TM) Wireless Networking Solutions Incorporate Smart MIMO Technology To Eliminate Wireless Dead Spots and Take Consumers Farther, Ruckus Wireles Inc. (Mar. 7, 2005), available at http://ruckuswireless.com/press/releases/20050307.php.

* cited by examiner

INCREASED WIRELESS COVERAGE PATTERNS

CROSS-REFERENCE TO RELATED APPLICATIONS

The present application is a continuation and claims the priority benefit of U.S. patent application Ser. No. 11/022,080 filed Dec. 23, 2004 and now U.S. Pat. No. 7,193,562, which claims the priority benefit of U.S. provisional patent application No. 60/630,499 filed Nov. 22, 2004. The disclosure of each of these applications is incorporated herein by reference.

The present application is related to U.S. patent application Ser. No. 11/010,076 filed Dec. 9, 2004, which is also incorporated herein by reference.

BACKGROUND

1. Field of the Invention

The present invention relates generally to wireless communications, and more particularly to a circuit board having a peripheral antenna apparatus with selectable antenna elements.

2. Description of the Related Art

In communications systems, there is an ever-increasing demand for higher data throughput and a corresponding drive to reduce interference that can disrupt data communications. For example, in an IEEE 802.11 network, an access point (i.e., base station) communicates data with one or more remote receiving nodes (e.g., a network interface card) over a wireless link. The wireless link may be susceptible to interference from other access points, other radio transmitting devices, changes or disturbances in the wireless link environment between the access point and the remote receiving node, and so on. The interference may be such to degrade the wireless link, for example by forcing communication at a lower data rate, or may be sufficiently strong to completely disrupt the wireless link.

One solution for reducing interference in the wireless link between the access point and the remote receiving node is to provide several omnidirectional antennas for the access point, in a "diversity" scheme. For example, a common configuration for the access point comprises a data source coupled via a switching network to two or more physically separated omnidirectional antennas. The access point may select one of the omnidirectional antennas by which to maintain the wireless link. Because of the separation between the omnidirectional antennas, each antenna experiences a different signal environment, and each antenna contributes a different interference level to the wireless link. The switching network couples the data source to whichever of the omnidirectional antennas experiences the least interference in the wireless link.

However, one limitation with using two or more omnidirectional antennas for the access point is that each omnidirectional antenna comprises a separate unit of manufacture with respect to the access point, thus requiring extra manufacturing steps to include the omnidirectional antennas in the access point. A further limitation is that the omnidirectional antenna typically comprises an upright wand attached to a housing of the access point. The wand typically comprises a rod exposed outside of the housing, and may be subject to breakage or damage.

Another limitation is that typical omnidirectional antennas are vertically polarized. Vertically polarized radio frequency (RF) energy does not travel as efficiently as horizontally polarized RF energy inside a typical office or dwelling space; additionally, most laptop computer network interface cards have horizontally polarized antennas. Typical solutions for creating horizontally polarized RF antennas to date have been expensive to manufacture, or do not provide adequate RF performance to be commercially successful.

A still further limitation with the two or more omnidirectional antennas is that because the physically separated antennas may still be relatively close to each other, each of the several antennas may experience similar levels of interference and only a relatively small reduction in interference may be gained by switching from one omnidirectional antenna to another omnidirectional antenna.

SUMMARY

An exemplary embodiment of the present invention provides for an antenna array for increasing wireless coverage. The exemplary antenna array includes a radio frequency (RF) signal modulator for generating a modulated RF signal. The array also includes a series of access points arranged in a substantially circular pattern around the periphery of the antenna array. A switching network controls a modulated RF signal radiation pattern emitted by each of the access points. Each of the access points emits a directional radiation pattern offset from the directional radiation pattern of each of the other access points. The directional radiation patterns emitted by the access points collectively generate a substantially 360-degree coverage pattern.

In another exemplary embodiment of the present invention, a method for reducing interference in a wirelessly-linked communications network is provided. Through this exemplary method, antenna elements are provided at a local wireless device, the local wireless device being communicatively coupled to the wirelessly-linked communications network. The antenna elements are selectively coupled to an RF signal modulator via a switching network. A first RF-modulated signal is received from a desired remote wireless device by one of the antenna elements while a second RF-modulated signal is received at a second of the elements. The second RF-modulated signal is received from an undesired wireless source; the second RF-modulated signal causing interference with the first RF-modulated signal. The second antenna element receiving the interfering RF-modulated signal is then decoupled from the RF signal modulator by the switching network such that the receiving wireless device no longer receives the interfering signal.

A further embodiment of the present invention provides for the creation of a 360-degree wireless coverage pattern. Through this method, an RF modulated signal is generated by a radio modulator and routed to a distribution point at a wireless device; antenna elements are selectively coupled to the distribution point. Each of the antenna elements emits a directional radiation pattern. The selective coupling of the antenna elements results in the collective generation of a substantially 360-degree coverage pattern. Further, the antenna elements are configured in a circular pattern around the periphery of a circuit board in the wireless device.

BRIEF DESCRIPTION OF THE DRAWINGS

The present invention will now be described with reference to drawings that represent a preferred embodiment of the invention. In the drawings, like components have the same reference numerals. The illustrated embodiment is intended to illustrate, but not to limit the invention. The drawings include the following figures.

DETAILED DESCRIPTION

A system for a wireless (i.e., radio frequency or RF) link to a remote receiving device includes a circuit board comprising communication circuitry for generating an RF signal and an antenna apparatus for transmitting and/or receiving the RF signal. The antenna apparatus includes two or more antenna elements arranged near the periphery of the circuit board. Each of the antenna elements provides a directional radiation pattern. In some embodiments, the antenna elements may be electrically selected (e.g., switched on or off) so that the antenna apparatus may form configurable radiation patterns. If multiple antenna elements are switched on, the antenna apparatus may form an omnidirectional radiation pattern.

Advantageously, the circuit board interconnects the communication circuitry and provides the antenna apparatus in one easily manufacturable printed circuit board. Including the antenna apparatus in the printed circuit board reduces the cost to manufacture the circuit board and simplifies interconnection with the communication circuitry. Further, including the antenna apparatus in the circuit board provides more consistent RF matching between the communication circuitry and the antenna elements. A further advantage is that the antenna apparatus radiates directional radiation patterns substantially in the plane of the antenna elements. When mounted horizontally, the radiation patterns are horizontally polarized, so that RF signal transmission indoors is enhanced as compared to a vertically polarized antenna.

Figure 1:
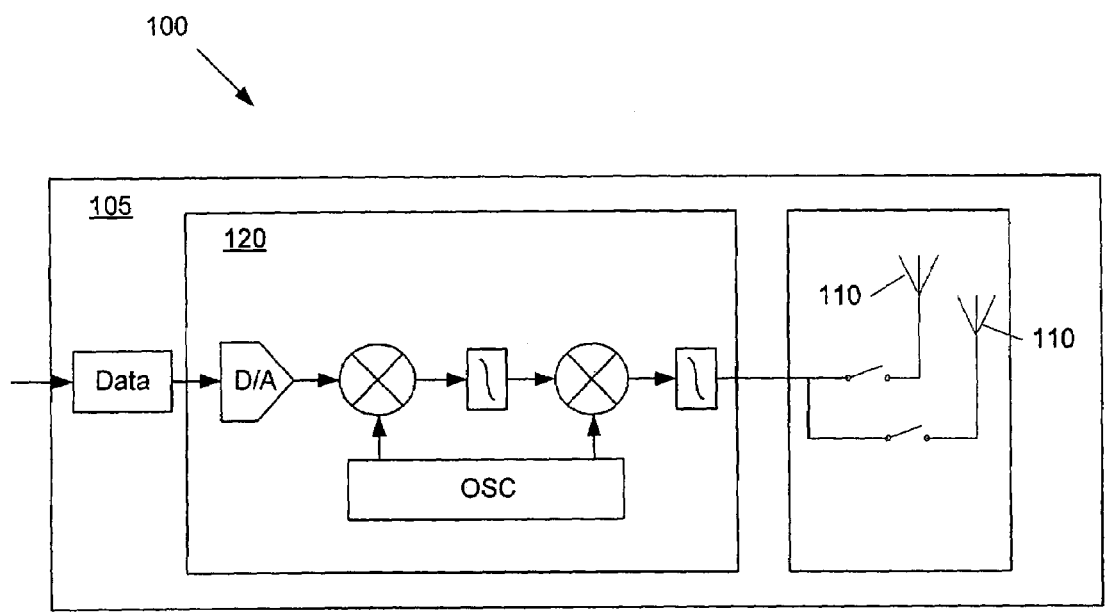
FIG. 1 illustrates an exemplary schematic for a system incorporating a circuit board having a peripheral antenna apparatus with selectable elements, in one embodiment in accordance with the present invention.

FIG. 1 illustrates an exemplary schematic for a system 100 incorporating a circuit board having a peripheral antenna apparatus with selectable elements, in one embodiment in accordance with the present invention. The system 100 may comprise, for example without limitation, a transmitter/receiver such as an 802.11 access point, an 802.11 receiver, a set-top box, a laptop computer, a television, a cellular telephone, a cordless telephone, a wireless VoIP phone, a remote control, and a remote terminal such as a handheld gaming device. In some exemplary embodiments, the system 100 comprises an access point for communicating to one or more remote receiving nodes over a wireless link, for example in an 802.11 wireless network.

The system 100 comprises a circuit board 105 including a radio modulator/demodulator (modem) 120 and a peripheral antenna apparatus 110. The radio modem 120 may receive data from a router connected to the Internet (not shown), convert the data into a modulated RF signal, and the antenna apparatus 110 may transmit the modulated RF signal wirelessly to one or more remote receiving nodes (not shown). The system 100 may also form a part of a wireless local area network by enabling communications among several remote receiving nodes. Although the disclosure will focus on a specific embodiment for the system 100 including the circuit board 105, aspects of the invention are applicable to a wide variety of appliances, and are not intended to be limited to the disclosed embodiment. For example, although the system 100 may be described as transmitting to a remote receiving node via the antenna apparatus 110, the system 100 may also receive RF-modulated data from the remote receiving node via the antenna apparatus 110.

Figure 2:
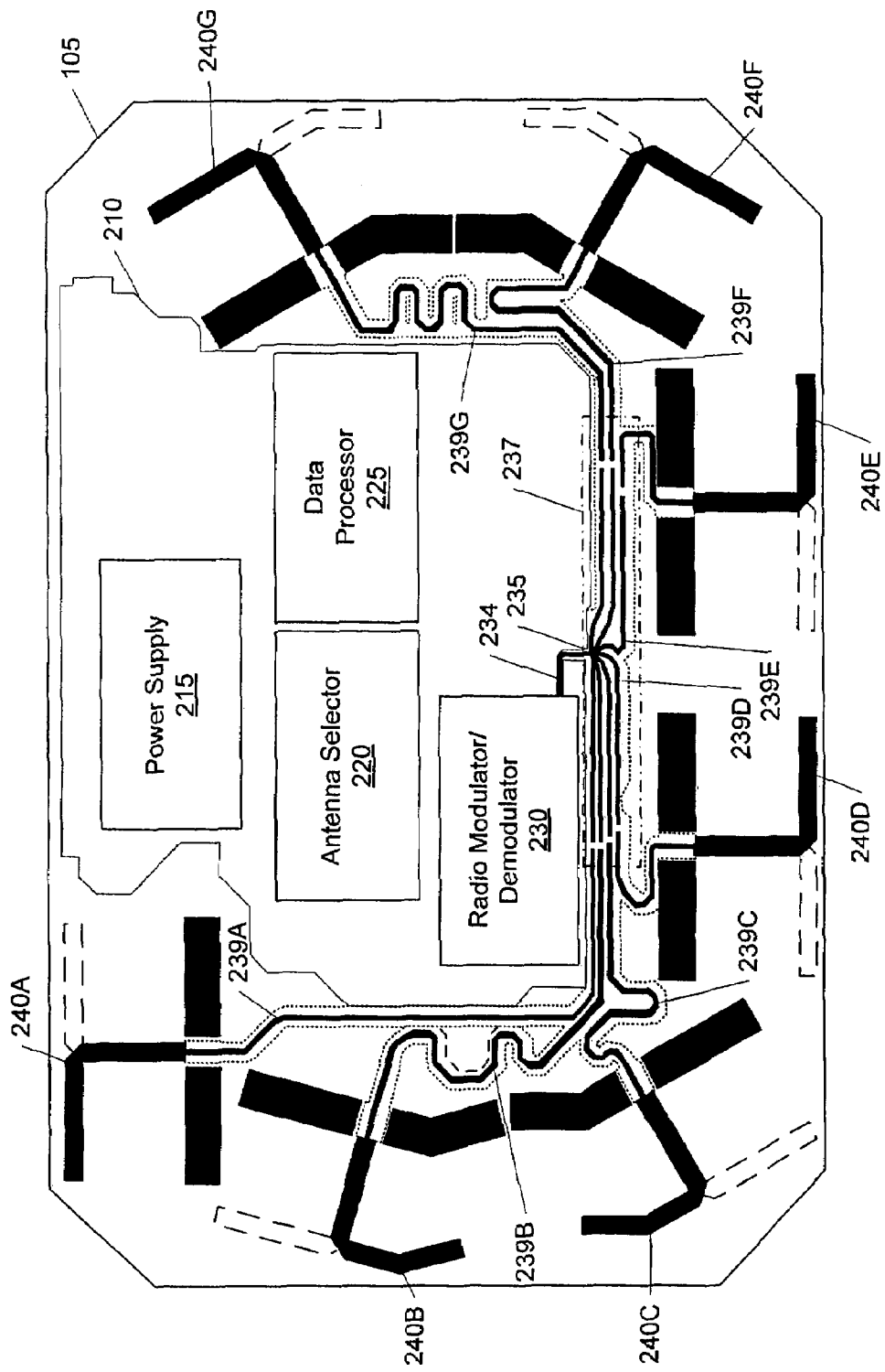
FIG. 2 illustrates the circuit board having the peripheral antenna apparatus with selectable elements of FIG. 1, in one embodiment in accordance with the present invention.

FIG. 2 illustrates the circuit board 105 having the peripheral antenna apparatus 110 with selectable elements of FIG. 1, in one embodiment in accordance with the present invention. In some embodiments, the circuit board 105 comprises a printed circuit board (PCB) such as FR4, Rogers 4003, or other dielectric material with four layers, although any number of layers is comprehended, such as six.

The circuit board 105 includes an area 210 for interconnecting circuitry including for example a power supply 215, an antenna selector 220, a data processor 225, and a radio modulator/demodulator (modem) 230. In some embodiments, the data processor 225 comprises well-known circuitry for receiving data packets from a router connected to the Internet (e.g., via a local area network). The radio modem 230 comprises communication circuitry including virtually any device for converting the data packets processed by the data processor 225 into a modulated RF signal for transmission to one or more of the remote receiving nodes, and for reception therefrom. In some embodiments, the radio modem 230 comprises circuitry for converting the data packets into an 802.11 compliant modulated RF signal.

From the radio modem 230, the circuit board 105 also includes a microstrip RF line 234 for routing the modulated RF signal to an antenna feed port 235. Although not shown, in some embodiments, an antenna feed port 235 is configured to distribute the modulated RF signal directly to antenna elements 240A-240G of the peripheral antenna apparatus 110 (not labeled) by way of antenna feed lines. In the embodiment depicted in FIG. 2, the antenna feed port 235 is configured to distribute the modulated RF signal to one or more of the selectable antenna elements 240A-240G by way of a switching network 237 and microstrip feed lines 239A-239G. Although described as microstrip, the feed lines 239 may also comprise coupled microstrip, coplanar strips with impedance transformers, coplanar waveguide, coupled strips, and the like.

The antenna feed port 235, the switching network 237, and the feed lines 239 comprise switching and routing components on the circuit board 105 for routing the modulated RF signal to the antenna elements 240A-240G. As described further herein, the antenna feed port 235, the switching network 237, and the feed lines 239 include structures for impedance matching between the radio modem 230 and the antenna elements 240. The antenna feed port 235, the switching network 237, and the feed lines 239 are further described with respect to FIG. 5.

As described further herein, the peripheral antenna apparatus comprises a plurality of antenna elements 240A-240G located near peripheral areas of the circuit board 105. Each of the antenna elements 240 produces a directional radiation pattern with gain (as compared to an omnidirectional antenna) and with polarization substantially in the plane of the circuit board 105. Each of the antenna elements may be arranged in an offset direction from the other antenna elements 240 so that the directional radiation pattern produced by one antenna element (e.g., the antenna element 240A) is offset in direction from the directional radiation pattern produced by another antenna element (e.g., the antenna element 240C). Certain antenna elements may also be arranged in substantially the same direction, such as the antenna elements 240D and 240E. Arranging two or more of the antenna elements 240 in the same direction provides spatial diversity between the antenna elements 240 so arranged.

In embodiments with the switching network 237, selecting various combinations of the antenna elements 240 produces various radiation patterns ranging from highly directional to omnidirectional. Generally, enabling adjacent antenna elements 240 results in higher directionality in azimuth as compared to selecting either of the antenna elements 240 alone. For example, selecting the adjacent antenna elements 240A and 240B may provide higher directionality than selecting either of the antenna elements 240A or 240B alone. Alternatively, selecting every other antenna element (e.g., the antenna elements 240A, 240C, 240E, and 240G) or all of the antenna elements 240 may produce an omnidirectional radiation pattern.

The operating principle of the selectable antenna elements 240 may be further understood by review of co-pending U.S. patent application Ser. No. 11/010,076, entitled "System and Method for an Omnidirectional Planar Antenna Apparatus with Selectable Elements," filed Dec. 9, 2004, and previously incorporated herein by reference.

Figure 3A:
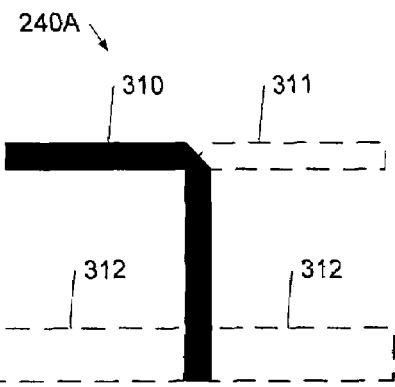
FIG. 3A illustrates a modified dipole for the antenna apparatus of FIG. 2, in one embodiment in accordance with the present invention.

FIG. 3A illustrates the antenna element 240A of FIG. 2, in one embodiment in accordance with the present invention. The antenna element 240A of this embodiment comprises a modified dipole with components on both exterior surfaces of the circuit board 105 (considered as the plane of FIG. 3A). Specifically, on a first surface of the circuit board 105, the antenna element 240A includes a first dipole component 310. On a second surface of the circuit board 105, depicted by dashed lines in FIG. 3, the antenna element 240A includes a second dipole component 311 extending substantially opposite from the first dipole component 310. The first dipole component 310 and the second dipole component 311 form the antenna element 240A to produce a generally cardioid directional radiation pattern substantially in the plane of the circuit board.

In some embodiments, such as the antenna elements 240B and 240C of FIG. 2, the dipole component 310 and/or the dipole component 311 may be bent to conform to an edge of the circuit board 105. Incorporating the bend in the dipole component 310 and/or the dipole component 311 may reduce the size of the circuit board 105. Although described as being formed on the surface of the circuit board 105, in some embodiments the dipole components 310 and 311 are formed on interior layers of the circuit board, as described herein.

The antenna element 240A may optionally include one or more reflectors (e.g., the reflector 312). The reflector 312 comprises elements that may be configured to concentrate the directional radiation pattern formed by the first dipole component 310 and the second dipole component 311. The reflector 312 may also be configured to broaden the frequency response of the antenna component 240A. In some embodiments, the reflector 312 broadens the frequency response of each modified dipole to about 300 MHz to 500 MHz. In some embodiments, the combined operational bandwidth of the antenna apparatus resulting from coupling more than one of the antenna elements 240 to the antenna feed port 235 is less than the bandwidth resulting from coupling only one of the antenna elements 240 to the antenna feed port 235. For example, with four antenna elements 240 (e.g., the antenna elements 240A, 240C, 240E, and 240G) selected to result in an omnidirectional radiation pattern, the combined frequency response of the antenna apparatus is about 90 MHz. In some embodiments, coupling more than one of the antenna elements 240 to the antenna feed port 235 maintains a match with less than 10 dB return loss over 802.11 wireless LAN frequencies, regardless of the number of antenna elements 240 that are switched on.

Figure 3B:
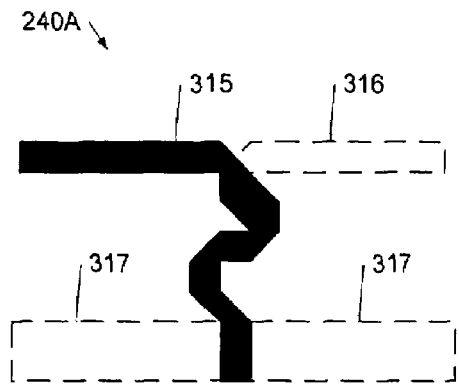
FIG. 3B illustrates a size reduced modified dipole for the antenna apparatus of FIG. 2, in an alternative embodiment in accordance with the present invention.

FIG. 3B illustrates the antenna element 240A of FIG. 2, in an alternative embodiment in accordance with the present invention. The antenna element 240A of this embodiment may be reduced in dimension as compared to the antenna element 240A of FIG. 3A. Specifically, the antenna element 240A of this embodiment comprises a first dipole component 315 incorporating a meander, a second dipole component 316 incorporating a corresponding meander, and a reflector 317. Because of the meander, the antenna element 240A of this embodiment may require less space on the circuit board 105 as compared to the antenna element 240A of FIG. 3A.

Figure 3C:
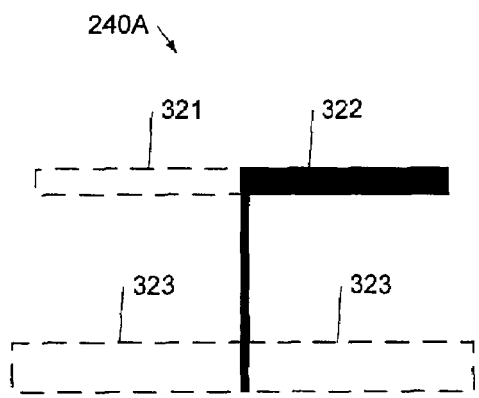
FIG. 3C illustrates an alternative modified dipole for the antenna apparatus of FIG. 2, in an alternative embodiment in accordance with the present invention.

FIG. 3C illustrates the antenna element 240A of FIG. 2, in an alternative embodiment in accordance with the present invention. The antenna element 240A of this embodiment includes one or more components on one or more layers internal to the circuit board 105. Specifically, in one embodiment, a first dipole component 321 is formed on an internal ground plane of the circuit board 105. A second dipole component 322 is formed on an exterior surface of the circuit board 105. As described further with respect to FIG. 4, a reflector 323 may be formed internal to the circuit board 105, or may be formed on the exterior surface of the circuit board 105. An advantage of this embodiment of the antenna element 240A is that vias through the circuit board 105 may be reduced or eliminated, making the antenna element 240A of this embodiment less expensive to manufacture.

Figure 3D:
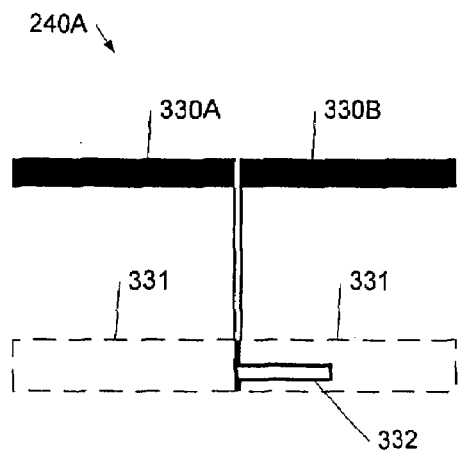
FIG. 3D illustrates a modified dipole with coplanar strip transition for the antenna apparatus of FIG. 2, in an alternative embodiment in accordance with the present invention.

FIG. 3D illustrates the antenna element 240A of FIG. 2, in an alternative embodiment in accordance with the present invention. The antenna element 240A of this embodiment includes a modified dipole with a microstrip to coplanar strip (CPS) transition 332 and CPS dipole arms 330A and 330B on a surface layer of the circuit board 105. Specifically, this embodiment provides that the CPS dipole arm 330A may be coplanar with the CPS dipole arm 330B, and may be formed on the same surface of the circuit board 105. This embodiment may also include a reflector 331 formed on one or more interior layers of the circuit board 105 or on the opposite surface of the circuit board 105. An advantage of this embodiment is that no vias are needed in the circuit board 105.

It will be appreciated that the dimensions of the individual components of the antenna elements 240A-G (e.g., the first dipole component 310, the second dipole component 311, and the reflector 312) depend upon a desired operating frequency of the antenna apparatus. Furthermore, it will be appreciated that the dimensions of wavelength depend upon conductive and dielectric materials comprising the circuit board 105, because speed of electron propagation depends upon the properties of the circuit board 105 material. Therefore, dimensions of wavelength referred to herein are intended specifically to incorporate properties of the circuit board, including considerations such as the conductive and dielectric properties of the circuit board 105. The dimensions of the individual components may be established by use of RF simulation software, such as IE3D from Zeland Software of Fremont, Calif.

Figure 4:
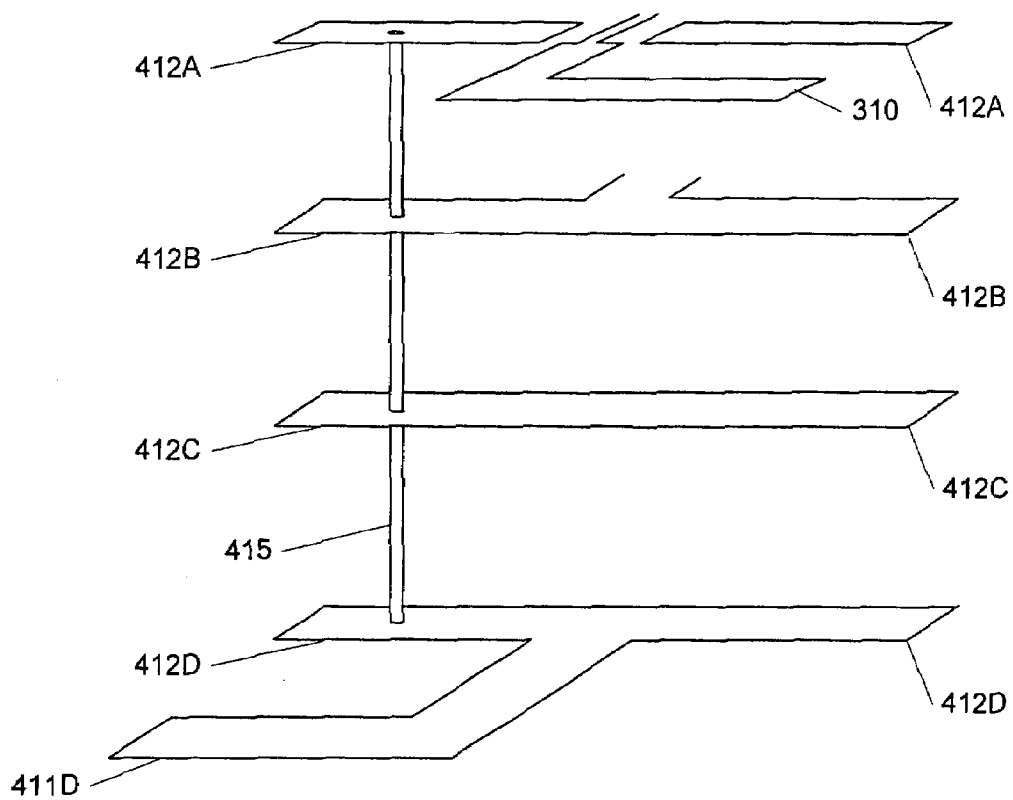
FIG. 4 illustrates the antenna element of FIG. 3A, showing multiple layers of the circuit board, in one embodiment of the invention.

FIG. 4 illustrates the antenna element 240A of FIG. 3A, showing multiple layers of the circuit board 105, in one embodiment of the invention. The circuit board 105 of this embodiment comprises a 60 mil thick stackup with three dielectrics and four metallization layers A-D, with an internal RF ground plane at layer B (10 mils from top layer A to the internal ground layer B). Layer B is separated by a 40 mil thick dielectric to the next layer C, which may comprise a power plane. Layer C is separated by a 10 mil dielectric to the bottom layer D.

The first dipole component 310 and portions 412A of the reflector 312 is formed on the first (exterior) surface layer A. In the second metallization layer B, which includes a connection to the ground layer (depicted as an open trace), corresponding portions 412B of the reflector 312 are formed. On the third metallization layer C, corresponding portions 412C of the reflector 312 are formed. The second dipole component 411D is formed along with corresponding portions of the reflector 412D on the fourth (exterior) surface metallization layer D. The reflectors 412A-D and the second dipole component 411D on the different layers are interconnected to the ground layer B by an array of metallized vias 415 (only one via 415 shown, for clarity) spaced less than 1/20th of a wavelength apart, as determined by an operating RF frequency range of 2.4-2.5 GHz for 802.11. It will be apparent to a person or ordinary skill that the reflector 312 comprises four layers, depicted as 412A-D.

An advantage of the antenna element 240A of FIG. 4 is that transitions in the RF path are avoided. Further, because of the cutaway portion of the reflector 412A and the array of vias interconnecting the layers of the circuit board 105, the antenna element 240A of this embodiment offers a good ground plane for the ground dipole 311 and the reflector element 312.

Figure 5A:
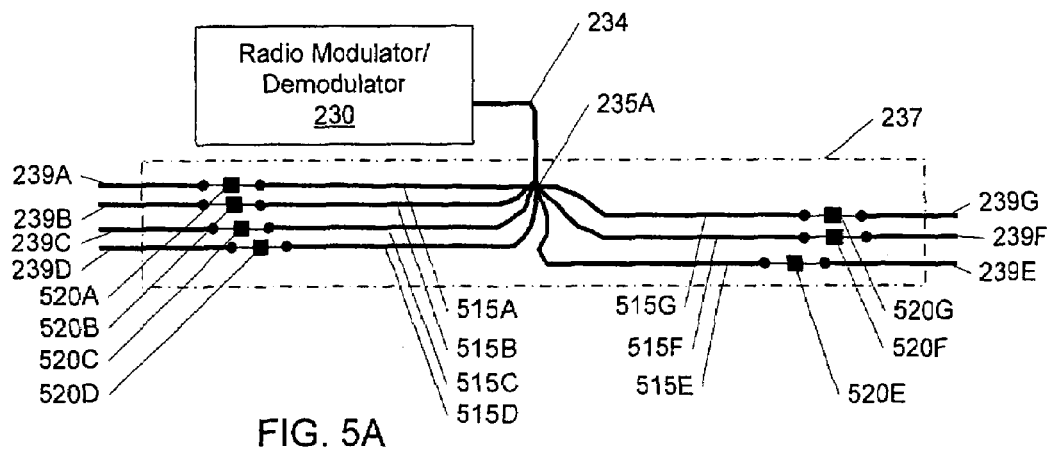
FIG. 5A illustrates the antenna feed port and the switching network of FIG. 2, in one embodiment in accordance with the present invention.

FIG. 5A illustrates the antenna feed port 235 and the switching network 237 of FIG. 2, in one embodiment in accordance with the present invention. The antenna feed port 235 of this embodiment receives the RF line 234 from the radio modem 230 into a distribution point 235A. From the distribution point 235A, impedance matched RF traces 515A-G extend to PIN diodes 520A-G. In one embodiment, the RF traces 515A-G comprise 20 mils wide traces, based upon a 10 mil dielectric from the internal ground layer (e.g., the ground layer B of FIG. 4). Feed lines 239A-G (only portions of the feed lines 239 are shown for clarity) extend from the PIN diodes 520A-G to each of the antenna elements 240.

Each PIN diode 520 comprises a single-pole single-throw switch to switch each antenna element 240 either on or off (i.e., couple or decouple each of the antenna elements 240 to the antenna feed port 235). In one embodiment, a series of control signals (not shown) is used to bias each PIN diode 520. With the PIN diode 520 forward biased and conducting a DC current, the PIN diode 520 is switched on, and the corresponding antenna element 240 is selected. With the PIN diode 520 reverse biased, the PIN diode 520 is switched off.

In one embodiment, the RF traces 515A-G are of length equal to a multiple of one half wavelength from the antenna feed port 235. Although depicted as equal length in FIG. 5A, the RF traces 515A-G may be unequal in length, but multiples of one half wavelength from the antenna feed port 235. For example, the RF trace 515A may be of zero length so that the PIN diode 520A is directly attached to the antenna feed port 235. The RF trace 515B may be one half wavelength, the RF trace 515C may be one wavelength, and so on, in any combination. The PIN diodes 520A-G are multiples of one half wavelength from the antenna feed port 235 so that disabling one PIN diode (e.g. the PIN diode 520A) does not create an RF mismatch that would cause RF reflections back to the distribution point 235A and to other traces 515 that are enabled (e.g., the trace 515B). In this fashion, when the PIN diode 520A is "off," the radio modem 230 sees a high impedance on the trace 515A, and the impedance of the trace 515B that is "on" virtually unaffected by the PIN diode 540A. In some embodiments, the PIN diodes 520A-G are located at an offset from the one half wavelength distance. The offset is determined to account for stray capacitance in the distribution point 235A and/or the PIN diodes 520A-G.

Figure 5B:
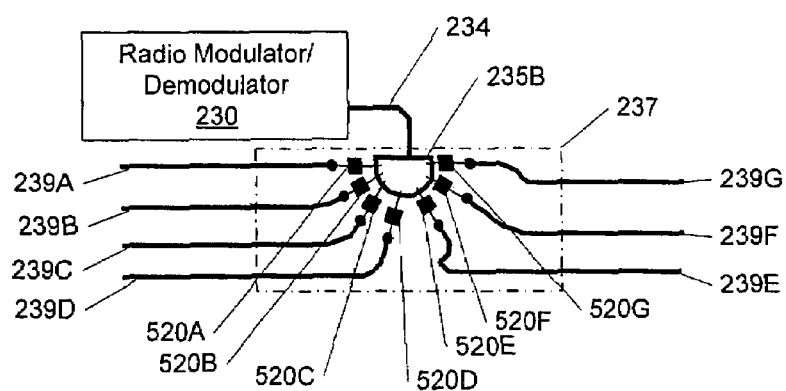
FIG. 5B illustrates the antenna feed port and the switching network of FIG. 2, in an alternative embodiment in accordance with the present invention.

FIG. 5B illustrates the antenna feed port 235 and the switching network 237 of FIG. 2, in an alternative embodiment in accordance with the present invention. The antenna feed port 235 of this embodiment receives the RF line 234 from the radio modem 230 into a distribution point 235B. The distribution point 235B of this embodiment is configured as a solder pad for the PIN diodes 520A-G. The PIN diodes 520A-G are soldered between the distribution point 235B and the ends of the feed lines 239A-G. In essence, the distribution point 235B of this embodiment acts as a zero wavelength distance from the antenna feed port 235. An advantage of this embodiment is that the feed lines extending from the PIN diodes 520A-G to the antenna elements 240A-G offer unbroken controlled impedance.

Figure 5C:
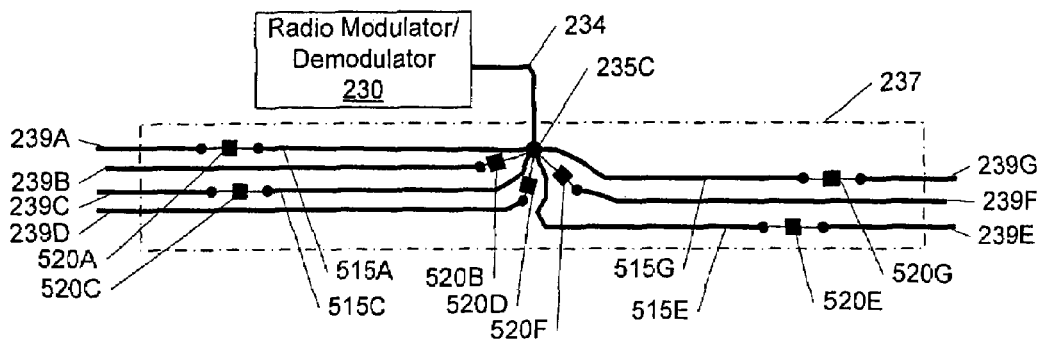
FIG. 5C illustrates the antenna feed port and the switching network of FIG. 2, in an alternative embodiment in accordance with the present invention.

FIG. 5C illustrates the antenna feed port and the switching network of FIG. 2, in an alternative embodiment in accordance with the present invention. This embodiment may be considered as a combination of the embodiments depicted in FIGS. 5A and 5B. The PIN diodes 520A, 520C, 520E, and 520G are connected to the RF traces 515A, 515C, 515E, and 515G, respectively, in similar fashion to that described with respect to FIG. 5A. However, the PIN diodes 520B, 520D, and 520F are soldered to a distribution point 235C and to the corresponding feed lines 239B, 239D, and 239F, in similar fashion to that described with respect to FIG. 5B.

Although the switching network 237 is described as comprising PIN diodes 520, it will be appreciated that the switching network 237 may comprise virtually any RF switching device such as a GaAs FET, as is well known in the art. In some embodiments, the switching network 237 comprises one or more single-pole multiple-throw switches. In some embodiments, one or more light emitting diodes (not shown) are coupled to the switching network 237 or the feed lines 239 as a visual indicator of which of the antenna elements 240 is on or off. In one embodiment, a light emitting diode is placed in circuit with each PIN diode 520 so that the light emitting diode is lit when the corresponding antenna element 240 is selected.

Referring to FIG. 2, because in some embodiments the antenna feed port 235 is not in the center of the circuit board 105, which would make the antenna feed lines 239 of equal length and minimum loss, the lengths of the antenna feed lines 239 may not comprise equivalent lengths from the antenna feed port 235. Unequal lengths of the antenna feed lines 239 may result in phase offsets between the antenna elements 240. Accordingly, in some embodiments not shown in FIG. 2, each of the feed lines 239 to the antenna elements 240 are designed to be as long as the longest of the feed lines 239, even for antenna elements 240 that are relatively close to the antenna feed port 235. In some embodiments, the lengths of the feed lines 239 are designed to be a multiple of a half-wavelength offset from the longest of the feed lines 239. In still other embodiments, the lengths of the feed lines 239 which are odd multiples of one half wavelength from the other feed lines 239 incorporate a "phase-inverted" antenna element 240 to compensate. For example, referring to FIG. 2, the antenna elements 240C and 240F are inverted by 180 degrees because the feed lines 239C and 239F are 180 degrees out of phase from the feed lines 239A, 239B, 239D, 239E, and 239G. In an antenna element 240 that is phase inverted, the first dipole component (e.g., surface layer) replaces the second dipole component (e.g., ground layer). It will be appreciated that this provides the 180 degree phase shift in the antenna element to compensate for the 180 degree feed line phase shift.

An advantage of the system 100 (FIG. 1) incorporating the circuit board 105 having the peripheral antenna apparatus with selectable antenna elements 240 (FIG. 2) is that the antenna elements 240 are constructed directly on the circuit board 105, therefore the entire circuit board 105 can be easily manufactured at low cost. As depicted in FIG. 2, one embodiment or layout of the circuit board 105 comprises a substantially square or rectangular shape, so that the circuit board 105 is easily panelized from readily available circuit board material. As compared to a system incorporating externally-mounted vertically polarized "whip" antennas for diversity, the circuit board 105 minimizes or eliminates the possibility of damage to the antenna elements 240.

A further advantage of the circuit board 105 incorporating the peripheral antenna apparatus with selectable antenna elements 240 is that the antenna elements 240 may be configured to reduce interference in the wireless link between the system 100 and a remote receiving node. For example, the system 100 communicating over the wireless link to the remote receiving node may select a particular configuration of selected antenna elements 240 that minimizes interference over the wireless link. For example, if an interfering signal is received strongly via the antenna element 240C, and the remote receiving node is received strongly via the antenna element 240A, selecting only the antenna element 240A may reduce the interfering signal as opposed to selecting the antenna element 240C. The system 100 may select a configuration of selected antenna elements 240 corresponding to a maximum gain between the system and the remote receiving node. Alternatively, the system 100 may select a configuration of selected antenna elements 240 corresponding to less than maximal gain, but corresponding to reduced interference. Alternatively, the antenna elements 240 may be selected to form a combined omnidirectional radiation pattern.

Another advantage of the circuit board 105 is that the directional radiation pattern of the antenna elements 240 is substantially in the plane of the circuit board 105. When the circuit board 105 is mounted horizontally, the corresponding radiation patterns of the antenna elements 240 are horizontally polarized. Horizontally polarized RF energy tends to propagate better indoors than vertically polarized RF energy. Providing horizontally polarized signals improves interference rejection (potentially, up to 20 dB) from RF sources that use commonly-available vertically polarized antennas.

The invention has been described herein in terms of several preferred embodiments. Other embodiments of the invention, including alternatives, modifications, permutations and equivalents of the embodiments described herein, will be apparent to those skilled in the art from consideration of the specification, study of the drawings, and practice of the invention. The embodiments and preferred features described above should be considered exemplary, with the invention being defined by the appended claims, which therefore include all such alternatives, modifications, permutations and equivalents as fall within the true spirit and scope of the present invention.

What is claimed is:

1. An antenna array for increasing wireless coverage, comprising:
    a radio frequency (RF) signal modulator configured to generate a modulated RF signal;
    a plurality of modulated RF signal emission points arranged in a substantially circular pattern around the periphery of the antenna array; and
    a switching network configured to control a modulated RF signal radiation pattern emitted by each of the plurality of modulated RF signal emission points, wherein each of the plurality of modulated RF signal emission points emits a directional radiation pattern offset from the directional radiation pattern of each of the other modulated RF signal emission points, the directional radiation patterns emitted by the plurality of modulated RF signal emission points collectively generating a substantially 360-degree coverage pattern.

2. The antenna array of claim 1, wherein the modulated RF signal includes an 802.11 compliant signal.

3. The antenna array of claim 1, wherein the RF signal modulator is intermediately coupled to a local area network by a router.

4. The antenna array of claim 3, wherein the local area network is further coupled to the Internet.

5. The antenna array of claim 1, wherein the coverage pattern generated by the antenna array is communicatively coupled to a coverage pattern generated by another antenna array in a wireless local area network.

6. The antenna array of claim 5, wherein the RF signal modulator is further configured to receive RF-modulated data from the other antenna array in the wireless local area network.

7. The antenna array of claim 1, wherein the coverage pattern is substantially horizontally polarized.

8. A method for reducing interference in a wirelessly-linked communications network, comprising:
    providing a plurality of antenna elements at a local wireless device, wherein the local wireless device is communicatively coupled to the wirelessly-linked communications network and the plurality of antenna elements are selectively coupled to a radio frequency (RF) signal modulator by a switching network;
    receiving a first RF-modulated signal at one of the plurality of antenna elements provided at the local wireless device, the first RF-modulated signal having been received from a desired remote wireless device over the wirelessly-linked communications network;
    receiving a second RF-modulated signal at a second of the plurality of antenna elements provided at the local wireless device, the second RF-modulated signal having been received from an undesired wireless source over the wirelessly-linked communications network, wherein the second RF-modulated signal interferes with the receipt of the first RF-modulated signal; and
    decoupling the second of the plurality of antenna elements from the RF-signal modulator via the switching network, wherein the decoupling of the second of the plurality of antenna elements from the RF-signal modulator prevents the local wireless device from receiving the interfering second RF-modulated signal from the undesired wireless source.

9. The method of claim 8, wherein the interference caused by the second RF-modulated signal causes communication of the first RF-modulated signal over the wirelessly-linked communications network at a lower data rate than intended for the first RF-modulated signal.

10. The method of claim 8, wherein the interference caused by the second RF-modulated signal causes complete disruption of the first RF-modulated signal over the wirelessly-linked communications network.

11. The method of claim 8, further comprising selecting a configuration of the antenna element receiving the first RF-modulated signal to correspond to a maximum gain between the local wireless device and a desired receiving node, wherein the configuration is controlled by the switching network.

12. The method of claim 8, further comprising selecting a configuration of a second antenna element also receiving the first RF-modulated signal to form a combined omnidirectional radiation pattern with a first antenna element from one of the plurality of antenna elements receiving the first RF-modulated signal and wherein the first and second antenna elements receiving the first RF-modulated signal individually generate a directional radiation pattern.

13. The method of claim 8, wherein the undesired wireless source includes an access point.

14. The method of claim 8, wherein the undesired wireless source includes a radio transmitting device.

15. A method for creating a 360-degree wireless coverage pattern, comprising:
  generating a radio frequency (RF) modulated signal at a radio modulator;
  routing the RF modulated signal from the radio modulator to a distribution point at a wireless device;
  selectively coupling a plurality of antenna elements to the distribution point, wherein each of the plurality of antenna elements emit a directional radiation pattern and wherein the selective coupling of the plurality of antenna elements collectively generates a substantially 360-degree coverage pattern, each of the plurality of antenna elements being configured in a circular pattern around the periphery of a circuit board in the wireless device.

16. The method of claim 15, wherein the substantially 360-degree coverage pattern is a horizontally polarized radiation pattern substantially in the plane of the circuit board in the wireless device.

17. The method of claim 15, wherein the directional radiation pattern of each of the selectively coupled plurality of antenna elements is offset from one another.

18. An antenna system, comprising:
  communication circuitry located in an interior area of a circuit board, the communication circuitry configured to generate an RF signal;
  a plurality of antenna elements, wherein one or more of the plurality of antenna elements are arranged proximate the edges of the circuit board, each of the one or more of the plurality of antenna elements configured to form a radiation pattern when coupled to the communication circuitry; and
  a switching network configured to selectively couple one or more of the plurality of antenna elements to the communication circuitry.

19. The antenna system of claim 18, wherein the one or more of the plurality of antenna elements arranged proximate the edges of the circuit board surround the communication circuitry.

20. The antenna system of claim 18, wherein the switching network includes one or more light emitting diodes that identify which of the one or more of the plurality of antenna elements are selectively coupled to the communication circuitry.

21. The antenna system of claim 18, wherein the selective coupling of the one or more of the plurality of antenna elements to the communication circuitry collectively generates a configurable radiation pattern.

22. The antenna system of claim 21, wherein the configurable radiation pattern is substantially in the plane of the circuit board.

23. The antenna system of claim 22, wherein the configurable radiation pattern is substantially horizontal.

24. The antenna system of claim 22, wherein the configurable radiation pattern is substantially vertical.

25. The antenna system of claim 21, wherein the configurable radiation pattern is substantially omnidirectional.

26. The antenna system of claim 21, wherein the configurable radiation pattern is less directional than any one of the one or more plurality of antenna elements.

27. The antenna system of claim 21, wherein the configurable radiation pattern reduces interference in a wireless link existing with a remote receiving node when compared to interference existing in a wireless link prior to the selective coupling of the one or more of the plurality of antenna elements to the communication circuitry to generate the configurable radiation pattern.

28. The antenna system of claim 18, wherein the communication circuitry is further coupled to a data processor configured to exchange data packets with the Internet.

29. The antenna system of claim 18, wherein the switching network includes one or more p-type, intrinsic, n-type diodes.

30. The antenna system of claim 18, wherein the switching network includes one or more field effect transistors.

31. The antenna system of claim 18, wherein the switching network selectively couples one or more of the plurality of antenna elements to the communication circuitry in response to interference in a wireless link existing with a remote receiving node.

* * * * *